US012566233B2

(12) United States Patent
Friesinger et al.

(10) Patent No.: US 12,566,233 B2
(45) Date of Patent: Mar. 3, 2026

(54) CALIBRATION SYSTEM AND CALIBRATION METHOD FOR A VECTOR NETWORK ANALYZER

(71) Applicant: Rohde & Schwarz GmbH & Co. KG, Munich (DE)

(72) Inventors: Maximilian Friesinger, Munich (DE); Thilo Bednorz, Erding (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 238 days.

(21) Appl. No.: 18/378,474

(22) Filed: Oct. 10, 2023

(65) Prior Publication Data

US 2025/0116746 A1 Apr. 10, 2025

(51) Int. Cl.
*G01R 35/00* (2006.01)
*G01R 27/28* (2006.01)
(52) U.S. Cl.
CPC ........... *G01R 35/007* (2013.01); *G01R 27/28* (2013.01)
(58) Field of Classification Search
CPC .. G01R 35/007; G01R 27/28; G01R 31/3183; G01R 31/3191; G01R 35/005
USPC ........................................ 324/601, 638, 650
See application file for complete search history.

(56) References Cited

U.S. PATENT DOCUMENTS

| | | | |
|---|---|---|---|
| 5,578,932 A | 11/1996 | Adamian | |
| 7,030,625 B1 | 4/2006 | Boudiaf et al. | |
| 7,034,548 B2 | 4/2006 | Anderson | |
| 10,365,345 B1 * | 7/2019 | Bradley | H04B 1/40 |
| 2025/0112665 A1 * | 4/2025 | Chen | H04B 17/14 |

* cited by examiner

*Primary Examiner* — Roberto Velez
(74) *Attorney, Agent, or Firm* — DITTHAVONG, STEINER, & MLOTKOWSKI

(57) ABSTRACT

The present disclosure relates to a calibration system for a vector network analyzer (VNA), having a plurality of N ports. The calibration system comprises a distribution unit having a plurality of D≤N ports; and a plurality of D≤N calibration units, respectively comprising a calibration circuit having first, second and third ports and an isolation circuit having first, second and third ports. For the respective calibration unit, the calibration circuit is configured to provide at least three different one-port calibration standards, such as open, short and match; the first port of the calibration circuit is arranged for being connected to a respective port of the VNA, the second port of the calibration circuit is connected to the first port of the isolation circuit, the third port of the calibration circuit is connected to a first matched load; the second port of the isolation circuit is connected to a respective port of the distribution unit, and the third port of the isolation circuit is connected to a second matched load. The distribution unit is configured to connect any one of its ports with all other of its ports.

12 Claims, 6 Drawing Sheets

11, 11A 11, 11B 11, 11C 11, 11D

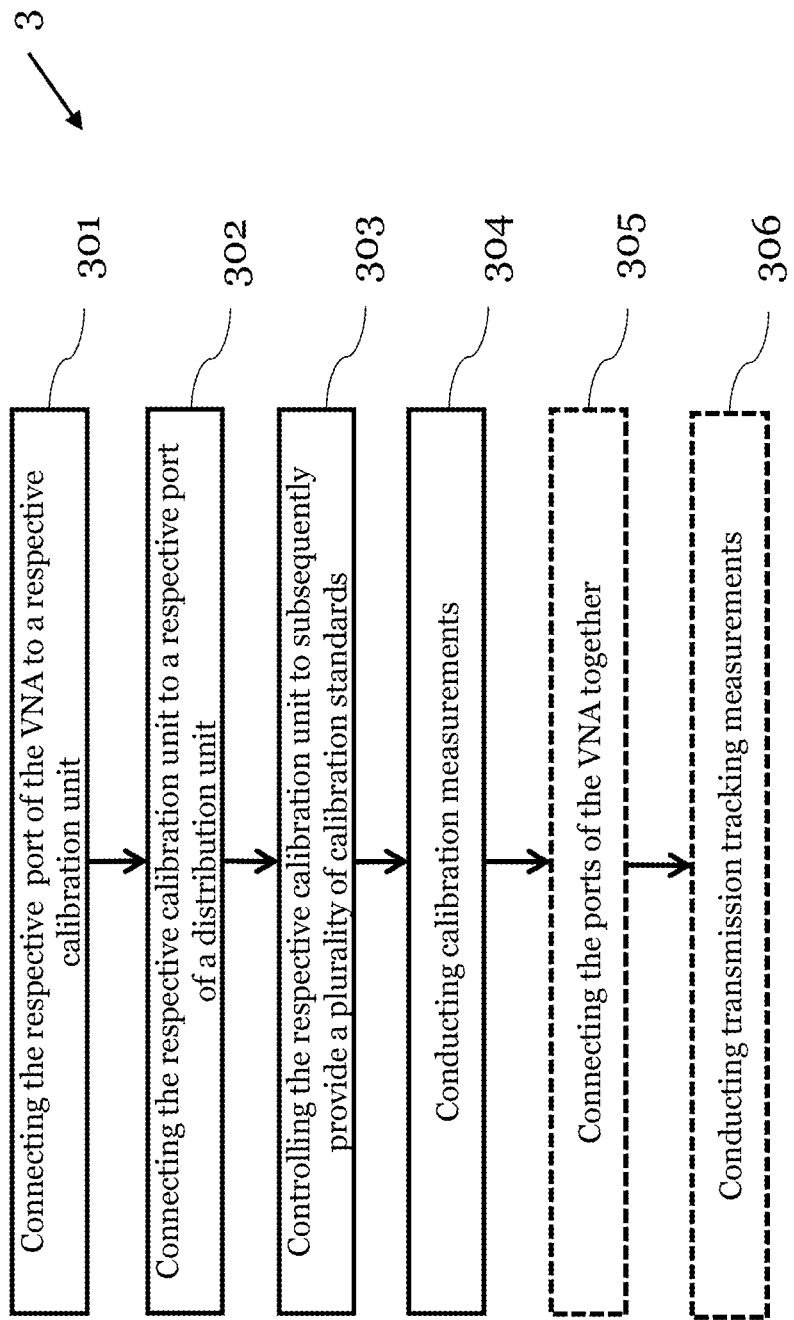

3

301  Connecting the respective port of the VNA to a respective calibration unit

302  Connecting the respective calibration unit to a respective port of a distribution unit 303  Controlling the respective calibration unit to subsequently provide a plurality of calibration standards 304  Conducting calibration measurements 305  Connecting the ports of the VNA together 306  Conducting transmission tracking measurements

Fig. 6

CALIBRATION SYSTEM AND CALIBRATION METHOD FOR A VECTOR NETWORK ANALYZER

TECHNICAL FIELD

Generally, the disclosure relates to the calibration of vector network analyzers (VNAs). More specifically, the disclosure relates a calibration system and a calibration method for a vector network analyzer.

BACKGROUND ART

A vector network analyzer (VNA) is a device for measuring the RF performance of a radio frequency device-under-test (DUT). The VNA can be used to characterize scattering parameters (S parameters) of the DUT.

Measurements with a VNA typically require a high accuracy and repeatability. However, different types of errors during such measurements can cause inaccuracies in the amplitude and phase of the measurement signals. For instance, systematic errors caused by non-ideal components in a VNA measurement setup, e.g. cable loss or impedance mismatch, can influence the measurement results.

Such errors can be removed or mitigated by means of calibration. For instance, calibration units can be used to connect so-called calibration standards at appropriate points in the measurement setup. A calibration routine can be carried out with the connected standards and the resulting calibration data can be used to correct recorded signals in a later measurement with the DUT. Such calibration measurements are typically performed over a specific temperature range.

In calibration setups for VNAs having multiple measurement ports, a plurality of calibration units may be connected to the VNA. To perform certain calibration measurements, such as transmission measurements, two calibration units are directly connected to each other before a temperature cycle of the DUT. The transmission path via the two calibration units should be reciprocal which means that the amplitude and phase has to be the same for a signal going from the first calibration unit to the second calibration unit and vice versa, i.e. the measurement in both directions should have the same amplitude and phase.

Thus, when performing a full calibration routine, the wiring between the devices needs to be changed at some point during the routine. However, removing the wiring during calibration and adding the wiring again takes a lot of time. Furthermore, the connectors wear down sooner and, thus, have to be replaced sooner.

In addition, depending on the number of VNA ports, the disconnecting process can take a lot of time. The more VNA ports, the higher the effort. Furthermore, the calibration is performed over a wide frequency band, e.g. several 10 GHz. If the resolution is small, each calibration measurement can take a lot of time.

SUMMARY

Thus, there is a need to provide an improved calibration system and an improved calibration process for a multi-port VNA which avoid the above-mentioned disadvantages. In particular, there is a need to perform a VNA calibration routine that does not require to change connections between devices during the routine.

These and other objectives are achieved by the embodiments provided in the enclosed independent claims. Advantageous implementations of the present disclosure are further defined in the dependent claims.

According to a first aspect, the present disclosure relates to a calibration system for a vector network analyzer, VNA, having a plurality of N ports. The calibration system comprises a distribution unit having a plurality of D≤N ports; and a plurality of D≤N calibration units, respectively comprising a calibration circuit having first, second and third ports, and an isolation circuit having first, second and third ports. For the respective calibration unit, the calibration circuit is configured to selectively provide at least three different one-port calibration standards, such as open, short and match; the first port of the calibration circuit is arranged for being connected to a respective port of the VNA, the second port of the calibration circuit is connected to the first port of the isolation circuit, the third port of the calibration unit is connected to a first matched load; the second port of the isolation circuit is connected to a respective port of the distribution unit, and the third port of the isolation circuit is connected to a second matched load. The distribution unit is configured to connect any one of its ports with all other of its ports.

As used herein, providing the short calibration standard may refer to the calibration circuit being configured to short its first port. As used herein, providing the open calibration standard may refer to the calibration circuit being configured to leave its first port open. As used herein, providing the match calibration standard may refer to the calibration circuit being configured to connect its first port to a matched load (e.g., 50 ohm).

As used herein, the calibration circuit and the isolation circuit may respectively refer to switching units. The switching unit can comprise an SP3T switch (single pole three-way throw switch). As such, the respective calibration unit can selectively connect different ports of the calibration circuit and the isolation circuit to each other and to the VNA, if connected, by means of the switching unit.

Based on the calibration system, a calibration routine can be performed without needing to disconnect and reconnect the calibration system from the VNA for some of these measurements. The calibration routine can comprise an OSM (open, short match) calibration and/or a transmission calibration. During such a calibration routine, the VNA can record calibration data. The VNA can be calibrated based on this calibration data. In particular, it is not necessary to re-wire the VNA when performing transmission measurements, because the distribution unit can provide 'unknown through' connectivity between any one of its ports corresponding to the respective port of the VNA with all other of its ports corresponding to all other of the respective ports of the VNA. Thus, the second port of the isolation circuit can be split up to a plurality of further calibration units, in particular two or more further calibration units of the same type. Thus, the calibration time can be reduced resulting in a higher throughput for a user.

As used herein, 'unknown through' connectivity may refer to a reciprocal connection (i.e., having identical transmission characteristics in both directions) which may to some extent be mismatched and attenuated.

In an embodiment, the respective calibration unit is configured to connect the first port of the calibration circuit to the second port of the isolation circuit in order to perform a transmission measurement.

In an embodiment, the respective calibration unit is configured to connect the first port of the calibration circuit to the one of the plurality of calibration standards; and the respective calibration unit is configured to disconnect the first port of the isolation circuit from the second port of the isolation circuit.

This provides the advantage that feedback from the second port of the isolation circuit towards the calibration circuit is minimized while performing an OSM calibration or while performing a measurement with the DUT.

In an embodiment, the calibration unit is configured to connect the first port of the isolation circuit to the third port of the isolation circuit.

This provides the advantage that the feedback from the second port of the isolation circuit towards the calibration circuit can be minimized. In particular, the first port of the isolation circuit is connected with the load of the isolation circuit by means of this connection.

In an embodiment, the distribution unit comprises a passive electrical network made from reciprocal materials.

This provides the advantage that measurements in both directions yield same amplitudes and phases.

In an embodiment, the distribution unit comprises an M:K network having M<N input ports and K<N output ports.

In an embodiment, the distribution unit comprises a network of 1:2 or 1:M coupling units.

This provides the advantage that 'unknown through' connectivity between respective ports of the distribution unit and thus between corresponding ports of the VNA is achieved cost-efficiently.

In an embodiment, the distribution unit comprises a network of 1:2 or 1:M switching units.

This provides the advantage that 'unknown through' connectivity between respective ports of the distribution unit and thus between corresponding ports of the VNA is achieved reconfigurably. In particular, switching units can be used instead of coupling units.

According to a second aspect, the present disclosure relates to a set, comprising a vector network analyzer, VNA, and a calibration system of the first aspect. The calibration system is configured to control the respective calibration unit to subsequently provide at least three one-port calibration standards, such as open, short and match, to the respective port of the VNA. The VNA is configured to conduct a measurement for the respective calibration standard provided to the respective port of the VNA, wherein the measurements for the respective calibration standard are conducted sequentially.

In an embodiment, the calibration system is configured to control the distribution unit to connect any one of its ports corresponding to the respective port of the VNA with all other of its ports corresponding to all other of the respective ports of the VNA. The VNA is configured to: conduct a respective transmission measurement from the respective port of the VNA via the distribution unit to all other of the respective ports of the VNA, wherein the measurements from the respective port of the VNA are conducted sequentially; and to conduct a respective transmission measurement from all other of the respective ports of the VNA via the distribution unit to the respective port of the VNA, wherein the measurements to the respective port of the VNA are conducted sequentially.

According to a third aspect, the present disclosure relates to a calibration process for a vector network analyzer, VNA, having a plurality of N ports. The calibration process comprises the steps of: connecting the respective port of the VNA to a respective calibration unit of a calibration system; connecting the respective calibration unit to a respective port of a distribution unit of the calibration system; controlling the respective calibration unit to subsequently provide a plurality of calibration standards including open, short and match to the respective port of the VNA; and conducting a measurement for the respective calibration standard provided to the respective port of the VNA, wherein the measurements for the respective calibration standard are conducted sequentially;

In an embodiment, the calibration process further comprises the steps of: controlling the distribution unit of the calibration system to connect any one of its ports corresponding to the respective port of the VNA with all other of its ports corresponding to all other of the respective ports of the VNA; and conducting a respective transmission measurement from the respective port of the VNA via the distribution unit to all other of the respective ports of the VNA, wherein the measurements from the respective port of the VNA are conducted_sequentially; and conducting a respective transmission measurement from all other of the respective ports of the VNA via the distribution unit to the respective port of the VNA, wherein the measurements to the respective port of the VNA are conducted sequentially.

The technical effects and advantages described above in relation with the calibration system of the first aspect equally apply to the set of the second aspect and to the calibration process of the third aspect.

BRIEF DESCRIPTION OF THE DRAWINGS

The above described aspects and implementation forms of the present disclosure will be explained in the following description of specific embodiments in relation to the enclosed drawings, in which:

FIG. 6 shows a flow chart of a calibration process for a VNA according to the present disclosure.

DETAILED DESCRIPTIONS OF EMBODIMENTS

Figure 1:
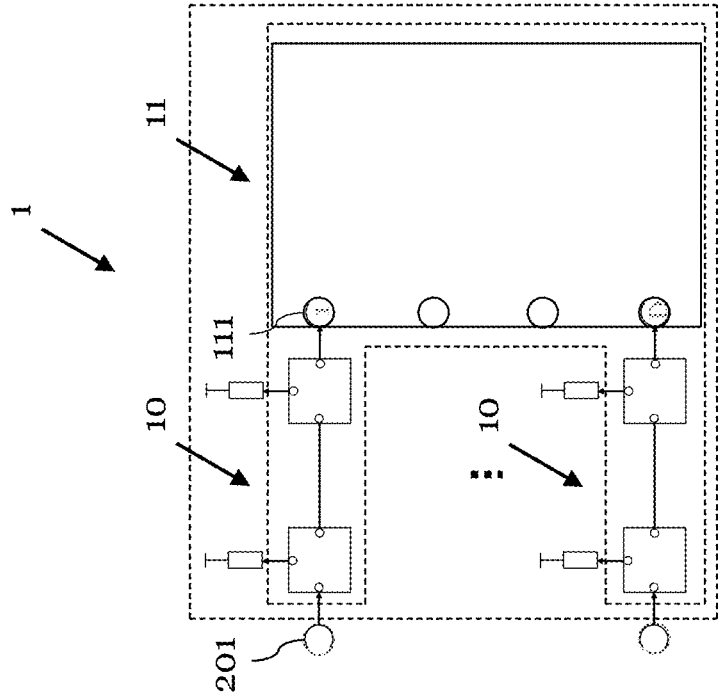
FIG. 1 shows a schematic diagram of a calibration system for a VNA according to the present disclosure.
Figure 2:
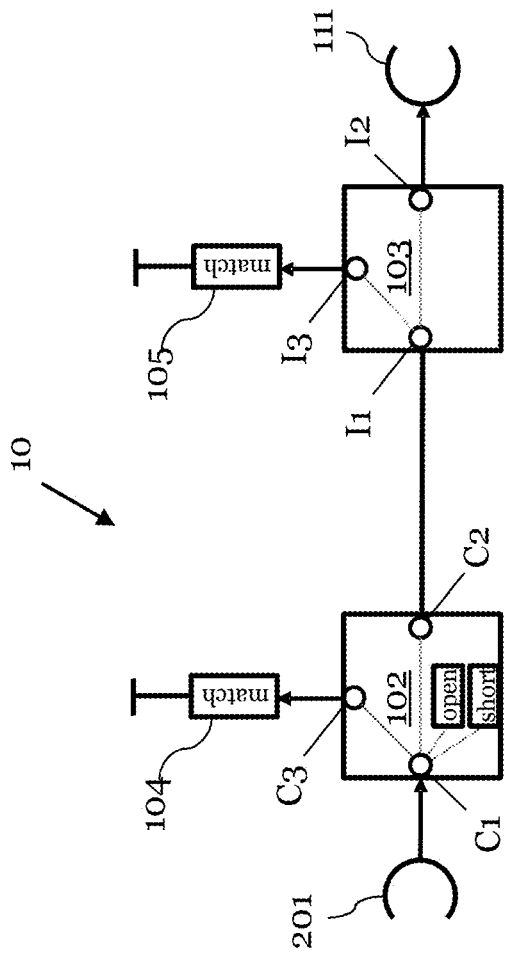
FIG. 2 shows a schematic diagram of a calibration unit according to the present disclosure.

FIG. 1 shows a schematic diagram of a calibration system 1 for a VNA 2 according to the present disclosure, and FIG. 2 shows a schematic diagram of a calibration unit 10 according to the present disclosure.

The calibration system 1 comprises a distribution unit 11 having a plurality of D≤N ports 111, wherein N represents the number of ports 201 of the VNA 2.

In particular, the distribution unit 11 may comprise a passive electrical network made from reciprocal materials. Accordingly, the distribution unit 11 may provide non-ideal but reciprocal 'unknown through' connectivity between its ports 111. For example, the provided 'unknown through' connectivity may be mismatched and attenuated to some extent.

The calibration system 1 further comprises a plurality of D≤N calibration units 10.

In accordance with FIG. 2, the respective calibration unit 10 comprises a calibration circuit 102 having first, second and third ports C1, C2, C3, and further comprises an isolation circuit 103 having first, second and third ports I1, I2, I3.

The calibration circuit 102 can be integrated in a chip. The isolation circuit 103 can also be integrated in a chip or in the chip of the calibration circuit 102. The distribution unit 11 can also be integrated in a chip or in the chip of the calibration circuit 102 and/or in the chip of the isolation circuit 103.

The calibration circuit 102 and the isolation circuit 103 can each comprise a switching unit. The respective switching unit can each comprise a SP3T (single pole three-way throw) switch.

For the respective calibration unit 10, the first port C1 of the calibration unit 102 is arranged for being connected to a respective port 201 of the VNA 2, the second port C2 of the calibration unit 102 is connected to the first port I1 of the isolation circuit 103, the third port C3 of the calibration unit 102 is connected to a first matched load 104; the second port I2 of the isolation circuit 103 is connected to a respective port 111 of the distribution unit 11, and the third port I3 of the isolation circuit 103 is connected to a second matched load 105. Note that each one of the first matched load 104 and the second matched load 105 may be arranged externally or internally of a common housing (indicated by different dashed outlines) of the calibration system 1. Further note that each one of the first matched load 104 and the second matched load 105 may form part of a chip/IC comprising the respective calibration unit 10. Accordingly, the third port C3 of the calibration unit 102 and the third port I3 of the isolation circuit 103 may be implemented as external or internal/virtual ports being in electrical communication with the corresponding matched loads 104, 105. The common housing may particularly enclose the plurality of calibration units 10 and the distribution unit 11.

For instance, the isolation between the second port I2 and the first port I1 of the isolation circuit 103 can be increased by the second matched load 105. The matched load 105 may comprise a match calibration standard, e.g. 50 ohm.

For the respective calibration unit 10, the calibration circuit 102 is configured to selectively provide at least three different one-port calibration standards, such as open, short and match (OSM). According to the non-binding example of FIG. 2, open and short calibration standards may form part of the calibration unit 10 and the match calibration standard may be arranged externally of the calibration unit 10.

As used herein, providing the open calibration standard may refer to the calibration circuit 102 being configured to leave its first port C1 open. As used herein, providing the short calibration standard may refer to the calibration circuit 102 being configured to short its first port C1. As used herein, providing the match calibration standard may refer to the calibration circuit 102 being configured to connect its first port C1 to a first matched load 104 (e.g., 50 ohm)

The respective calibration unit 10 may further be configured to connect the first port C1 of the calibration circuit 102 to the second port I2 of the isolation circuit 103 in order to perform a transmission measurement.

The respective calibration unit 10 may further be configured to connect the first port C1 of the calibration circuit 102 to the one of the plurality of calibration standards; and the respective calibration unit 10 may be configured to disconnect the first port I1 of the isolation circuit 103 from the second port I2 of the isolation circuit 103.

The calibration unit 10 may further be configured to connect the first port I1 of the isolation circuit 103 to the third port I3 of the isolation circuit 103.

The distribution unit 11 is configured to connect any one of its ports 111 with all other of its ports 111. This provides 'unknown through' connectivity between respective ports 111 of the distribution unit 11 and thus between corresponding ports 201 of the VNA 2.

Figure 3:
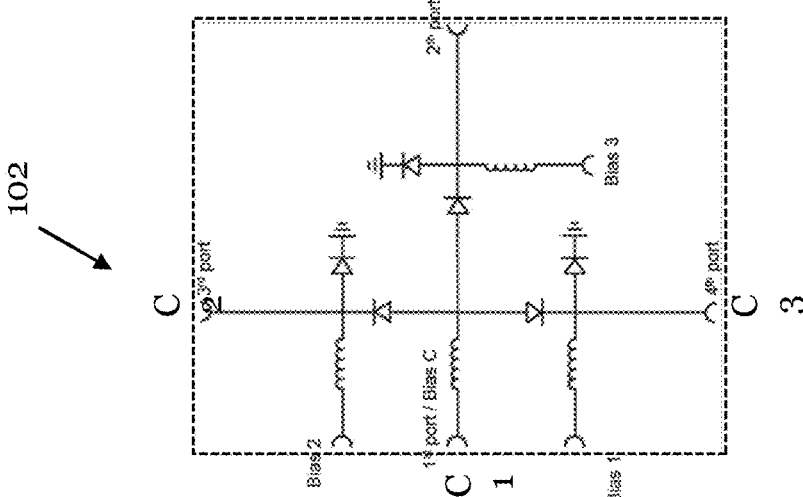
FIG. 3 shows a schematic diagram of a calibration circuit according to the present disclosure.

FIG. 3 shows a schematic diagram of a calibration circuit 102 according to the present disclosure.

In particular, FIG. 3 illustrates a possible circuit diagram of the calibration circuit 102.

The calibration circuit 102 can comprise PIN diodes which are used as switches. Depending on the bias voltage at different terminals of the circuit, the first port C1 of the calibration circuit 102 is connected to none of the other ports (open) or to port C2 or C3.

For instance, to generate a short calibration standard at the first port C1 of the calibration circuit 102, the bias C is set to 0V, the bias 1 is set to 12 V, the bias 2 is set to 12 V and the bias 3 is set to 12V. To generate an open calibration standard at the first port C1 of the isolation circuit, the bias C is set to 0V, the bias 1 is set to −12 V, the bias 2 is set to 12 V and the bias 3 is set to 12V.

Performing a calibration measurement with each calibration standard can comprise: sending an RF signal to the first port C1 of the calibration circuit 102 by means of the VNA 2 and analyzing a response signal received at the same or a different VNA port 201 (depending on the standard and/or the calibration measurement).

Figure 4:
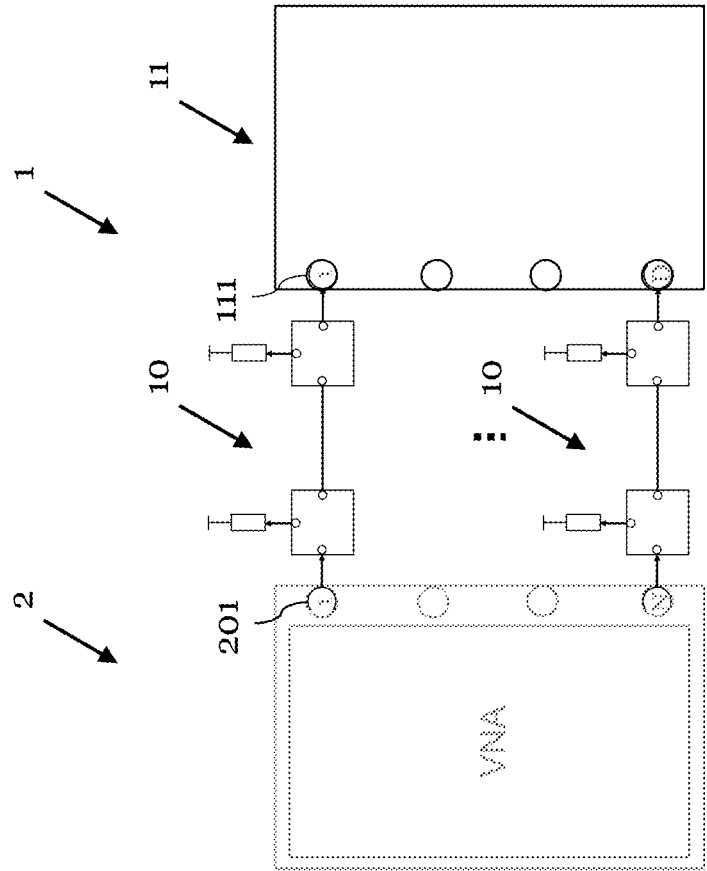
FIG. 4 shows a schematic diagram of a set according to the present disclosure comprising a VNA and a calibration system for the VNA.

FIG. 4 shows a schematic diagram of a set 1, 2 according to the present disclosure comprising a VNA 2 and a calibration system 1 for the VNA 2.

The calibration system 1 comprises a distribution unit 11 having a plurality of D=N ports 111, wherein N represents the number of ports 201 of the VNA 2. The calibration system 1 further comprises a plurality of D=N calibration units 10.

A dimensioning of the calibration system 1 in accordance with D≤N would also be possible, and then require subsequent measurements for multiple groups of D≤N ports 201 of the VNA 2.

For calibration measurements, the calibration system 1 is configured to control the respective calibration unit 10 to subsequently provide at least three different one-port calibration standards, such as open, short and match, to the respective port 201 of the VNA 2.

The VNA 2 is configured to conduct a measurement for the respective calibration standard provided to the respective port 201 of the VNA 2, wherein the measurements for the respective calibration standard are conducted sequentially.

For example, the measurements for the open calibration standard may be conducted sequentially for all ports 201 of the VNA 2 while all the calibration units 10 provide the open calibration standard. The same applies for the short and match calibration standards.

For transmission measurements, the calibration system 1 is further configured to control the distribution unit 11 to connect any one of its ports 111 corresponding to the respective port 201 of the VNA 2 with all other of its ports 111 corresponding to all other of the respective ports 201 of the VNA 2 (i.e., provide a 1:(N−1) connectivity).

The VNA 2 is further configured to conduct a respective transmission measurement from the respective port 201 of the VNA 2 via the distribution unit 11 to all other of the respective ports 201 of the VNA 2, wherein the measurements from the respective port 201 of the VNA 2 are conducted sequentially. The VNA 2 is further configured to conduct a respective transmission measurement from all other of the respective ports 201 of the VNA 2 via the distribution unit 11 to the respective port 201 of the VNA 2, wherein the measurements to the respective port 201 of the VNA 2 are conducted_sequentially.

Thus, based on the 1:(N−1) connectivity provided by the distribution unit 11, the VNA 2 can conduct transmission measurements from one of its ports 201 to all other of its ports 201 sequentially, and can conduct transmission measurements in the reverse direction from all other of its ports 201 to the one of its ports 201 sequentially, too, without any re-wiring.

With the arrangement shown in FIG. 4, an N-port error correction can be performed. This is achieved by the distribution unit 11 which can route any one of the ports 201 of the VNA 2 to all other of the ports 201 of the VNA 2, providing the necessary (N−1) unknowns for a system error correction algorithm.

FIGS. 5A-5D show schematic diagrams of various distribution units 11 according to the present disclosure.

Figure 5A:
FIGS. 5A-5D show schematic diagrams of various distribution units according to the present disclosure.
Figure 5B:
Figure 5B:
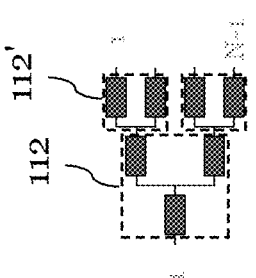

For example, in accordance with FIGS. 5A and 5B, the distribution unit 11 may comprise a network of 1:2 or 1:M coupling units 112 (i.e., power splitters), wherein M≤2.

In FIG. 5A, the distribution unit 11 comprises an N-port network having N/2 input ports 111 and N/2 output ports 111. Generally, the distribution unit 11 may comprise an M:K network having M<N input ports and K<N output ports.

In FIG. 5B, the distribution unit 11 comprises an N-port network having 1 input port 111 and N−1 output ports 111. FIG. 5 also indicates an exemplary implementation of the N-port network by means of 3 dB coupling units 112 and 6 dB coupling units 112'. In this example, the respective coupling unit may connect one port to any other of its M further ports.

Figure 5C:
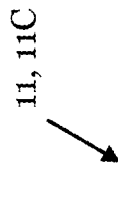
Figure 5C:
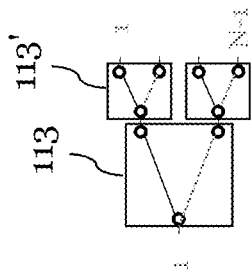
Figure 5D:
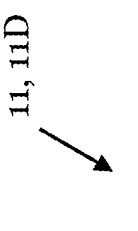
Figure 5D:
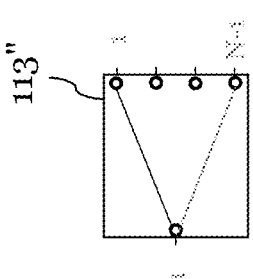

Alternatively, in accordance with FIGS. 5C and 5D, the distribution unit 11 may comprise a network of 1:2 or 1:M switching units 113, wherein M≤2. In other words, the respective switching unit 113 may connect one port to any one of its M further ports. Note that using switching units 113 implies appropriate reconfigurations of the network of switching units 113 depending on the respective transmission measurement.

Irrespective of the concrete implementation, only 1 (i.e., one) port 201 of the VNA 2 consistently drives all the transmission measurements while all other N−1 ports 201 of the VNA 2 sequentially conduct their respective transmission measurements.

Thereby, a number of N×(N−1) sequential transmission measurements between pairs of the N ports 201 of the VNA 2 may be reduced down to N sequential transmission measurements between each of the N ports 201 and all other N−1 ports 201.

FIG. 6 shows a flow chart of a calibration process for a VNA according to the present disclosure.

The calibration process 3 comprises a step of connecting 301 the respective port 201 of the VNA 2 to a respective calibration unit 10 of a calibration system 1.

The calibration process 3 further comprises a step of connecting 302 the respective calibration unit 10 to a respective port 111 of a distribution unit 11 of the calibration system 1.

The calibration process 3 further comprises a step of controlling 303 the respective calibration unit 10 to subsequently provide at least three one-port calibration standards such as open, short and match to the respective port 201 of the VNA 2.

The calibration process 3 further comprises a step of conducting 304 a measurement for the respective calibration standard provided to the respective port 201 of the VNA 2, wherein the measurements for the respective calibration standard are conducted sequentially;

The calibration process 3 may further comprise a step of controlling 305 the distribution unit 11 of the calibration system 1 to connect any one of its ports 111 corresponding to the respective port 201 of the VNA 2 with all other of its ports 111 corresponding to all other of the respective ports 201 of the VNA 2.

The calibration process 3 may further comprise a step of conducting 306 a respective transmission measurement from the respective port 201 of the VNA 2 via the distribution unit 11 to all other of the respective ports 201 of the VNA 2, wherein the measurements from the respective port 201 of the VNA 2 are conducted sequentially; and conducting a respective transmission measurement from all other of the respective ports 201 of the VNA 2 via the distribution unit 11 to the respective port 201 of the VNA 2, wherein the measurements to the respective port 201 of the VNA 2 are conducted sequentially.

The calibration measurements can be carried out over a specified temperature range and the acquired calibration data for each calibration measurement can be saved on the VNA and/or on the calibration device, e.g. on an EEPROM of the VNA, for performing a measurement calibration.

All features described above or features shown in the figures can be combined with each other in any advantageous manner within the scope of the disclosure.

The invention claimed is:

1. A calibration system for a vector network analyzer, VNA, having a plurality of N ports, wherein N represents the number of ports of the VNA, the calibration system comprising:

a distribution unit having a plurality of D ports, wherein D represents the number of ports of the distribution unit, and D≤N; and a plurality of D calibration units, respectively comprising a calibration circuit having first, second and third ports, and an isolation circuit having first, second and third ports;

wherein for a respective calibration unit the calibration circuit is configured to selectively provide at least three different one-port calibration standards;

the first port of the calibration circuit is arranged for being connected to a respective port of the VNA, the second port of the calibration circuit is connected to the first port of the isolation circuit, the third port of the calibration circuit is connected to a first matched load;

the second port of the isolation circuit is connected to a respective port of the distribution unit, and the third port of the isolation circuit is connected to a second matched load;

wherein the distribution unit is configured to connect any one of its ports with all other of its ports.

2. The calibration system of claim 1, wherein the respective calibration unit is configured to connect the first port of the calibration circuit to the second port of the isolation circuit in order to perform a transmission measurement.

3. The calibration system of claim 1, wherein the respective calibration unit is configured to connect the first port of the calibration circuit to any one of the plurality of calibration standards; and wherein the respective calibration unit is configured to disconnect the first port of the isolation circuit from the second port of the isolation circuit.

4. The calibration system of claim 1,
wherein the calibration unit is configured to connect the first port of the isolation circuit to the third port of the isolation circuit.

5. The calibration system of claim 1,
wherein the distribution unit comprises a passive electrical network made from reciprocal materials.

6. The calibration system of claim 1,
wherein the distribution unit comprises an M:K network having M input ports and K output ports, wherein M represents the number of input ports of the distribution unit, and K represents the number of output ports of the distribution unit.

7. The calibration system of claim 1,
wherein the distribution unit comprises a network ratio of 1:2 or 1:N coupling units in series.

8. The calibration system of claim 1,
wherein the distribution unit comprises a network ratio of 1:2 or 1:N switching units in series.

9. A set, comprising
a vector network analyzer, VNA, and
a calibration system of claim 1,
wherein the calibration system is configured to control the respective calibration unit to subsequently provide at least three different one-port calibration standards, such as open, short and match, to the respective port of the VNA;
wherein the VNA is configured to conduct a measurement for the respective calibration standard provided to the respective port of the VNA, wherein the measurements for the respective calibration standard are conducted sequentially.

10. The set according to claim 9, wherein the calibration system is configured to control the distribution unit to connect any one of its ports corresponding to the respective port of the VNA with all other of its ports corresponding to all other of the respective ports of the VNA;
wherein the VNA is configured to conduct a respective transmission measurement from the respective port of the VNA via the distribution unit to all other of the respective ports of the VNA, wherein the measurements from the respective port of the VNA are conducted sequentially; and
wherein the VNA is configured to conduct a respective transmission measurement from all other of the respective ports of the VNA via the distribution unit to the respective port of the VNA, wherein the measurements to the respective port of the VNA are conducted sequentially.

11. A calibration method for a vector network analyzer, VNA, having a plurality of N ports, wherein N represents the number of ports of the VNA, the calibration method comprising the steps of:
providing a calibration system comprising:
a distribution unit having a plurality of D ports, wherein D represents the number of ports of the distribution unit, and D≤N; and
a plurality of D calibration units, respectively comprising a calibration circuit having first, second and third ports, and an isolation circuit having first, second and third ports;
connecting, for a respective calibration unit: the first port of the calibration circuit to a respective port of the VNA,
the second port of the calibration circuit to the first port of the isolation circuit,
the third port of the calibration circuit to a first matched load;
the second port of the isolation circuit to a respective port of the distribution unit, and
the third port of the isolation circuit to a second matched load;
controlling the respective calibration unit to subsequently provide at least three different one-port calibration standards such as open, short and match to the respective port of the VNA; and
conducting a measurement for the respective calibration standard provided to the respective port of the VNA, wherein the measurements for the respective calibration standard are conducted sequentially.

12. The calibration method of claim 11, further comprising the steps of:
controlling the distribution unit of the calibration system to connect any one of its ports corresponding to the respective port of the VNA with all other of its ports corresponding to all other of the respective ports of the VNA;
conducting a respective transmission measurement from the respective port of the VNA via the distribution unit to all other of the respective ports of the VNA, wherein the measurements from the respective port of the VNA sequentially; and
conducting a respective transmission measurement from all other of the respective ports of the VNA via the distribution unit to the respective port of the VNA, wherein the measurements to the respective port of the VNA sequentially.

* * * * *